(12) United States Patent
Li et al.

(10) Patent No.: US 12,476,649 B2
(45) Date of Patent: Nov. 18, 2025

(54) DIGITAL CORRECTION METHOD FOR DYNAMIC RANGE EXPANSION OF MULTIPLE ADCs

(71) Applicant: University of Electronic Science and Technology of China, Chengdu (CN)

(72) Inventors: Hao Li, Chengdu (CN); Jiawei Cao, Chengdu (CN); Yangbin Wei, Chengdu (CN); Xuyang Li, Chengdu (CN); Guangkun Luo, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 79 days.

(21) Appl. No.: 18/635,047

(22) Filed: Apr. 15, 2024

(65) Prior Publication Data
US 2024/0396567 A1   Nov. 28, 2024

(30) Foreign Application Priority Data
May 22, 2023   (CN) .......................... 202310577720.3

(51) Int. Cl.
*H03M 1/10*   (2006.01)
*H03M 1/12*   (2006.01)
*H03M 1/16*   (2006.01)
*H03M 1/18*   (2006.01)

(52) U.S. Cl.
CPC ....... *H03M 1/1023* (2013.01); *H03M 1/1215* (2013.01); *H03M 1/167* (2013.01); *H03M 1/18* (2013.01)

(58) Field of Classification Search
CPC ...... H03M 1/1023; H03M 1/167; H03M 1/18; H03M 1/1215; Y02D 30/70
See application file for complete search history.

(56) References Cited

U.S. PATENT DOCUMENTS

| | | | | |
|---|---|---|---|---|
| 7,227,479 | B1 * | 6/2007 | Chen ................... | H03M 1/1004 341/118 |
| 9,154,147 | B2 * | 10/2015 | Biallais ............... | H03M 1/0607 |

* cited by examiner

*Primary Examiner* — Khai M Nguyen
(74) *Attorney, Agent, or Firm* — Zhigang Ma (57) ABSTRACT

A digital correction method for dynamic range expansion of multiple ADCs includes: obtaining gain and offset correction values of other channels relative to a standard channel $CH_1$ based on iterative computations through positive and negative amplitude auxiliary values and positive and negative base values, then performing gain-offset error correction on the other channels, and then calculating phase differences of the other channels relative to the standard channel $CH_1$ and constructing fractional delay filters with a Farrow structure corresponding to the channels, correcting sampling data $X_2, \ldots, X_M$ after performing the gain-offset error correction. Digital correction of sampling data collected from multiple channels in a multi-ADC system is realized while ensuring that respective dynamic ranges of the sampling data with different gains output by the multiple channels are not lost.

2 Claims, 6 Drawing Sheets

DIGITAL CORRECTION METHOD FOR DYNAMIC RANGE EXPANSION OF MULTIPLE ADCs

TECHNICAL FIELD

The disclosure relates to the field of dynamic signal analysis (DSA), particularly to a digital correction method for dynamic range expansion of multiple analog-to-digital converters (ADCs).

BACKGROUND

A maximum range and a minimum measurable signal of an instrument determine performance of dynamic testing, and the minimum measurable signal of the instrument is determined by noise suppression performance of an analog device corresponding to a channel and a resolution of an analog-to-digital converter (ADC). Throughout a development process of indices in a dynamic range (DR) of a dynamic signal analyzer, improvements of the ADC resolution and a process of the analog device can lead to a significant increase in the DR. However, with the increasing resolution of ADC nowadays, the improvement in the process of the analog device becomes slower and more difficult. When using a single ADC to collect signals under a condition that a noise of the channel is ideal, a DR of a system depends on an index of a signal-to-noise ratio of the ADC, and signals beyond a measurement range of the single ADC cannot be tested by the system. Therefore, using multiple ADCs to complete data acquisition can break through the DR limitation corresponding to the single ADC.

A key to an expansion technology of the multiple ADCs is how to integrate sampling data collected from multiple channels into one channel. However, the expansion technology faces two major challenges: 1) how to correct gains and offsets of the sampling data collected from the multiple channels to unify the multiple ADCs at the same quantization accuracy; and 2) how to correct different time delays between the sampling data collected from the multiple channels.

SUMMARY

An objective of the disclosure is to overcome deficiencies in the related art, thereby providing a digital correction method for dynamic range expansion of multiple analog-to-digital converters (ADCs), which can complete digital correction of sampling data collected from multiple channels in a multi-ADC system while ensuring that respective dynamic ranges of the sampling data with different gains output by the multiple channels are not lost, so as to integrate the sampling data collected from the multiple ADCs into a data stream in a single channel.

In order to achieve the above objective, the digital correction method for dynamic range expansion of multiple ADCs is provided by the disclosure, a number of channels of the multiple ADCs is M; and the digital correction method includes the following steps:

step 1, obtaining a gain correction value $A_m$, $1 \leq m \leq M-1$ and an offset correction value $B_m$, $1 \leq m \leq M-1$ of each channel in target channels of the M channels by iterative computations, and performing gain-offset error correction on each of the target channels based on the gain correction value $A_m$ and the offset correction value $B_m$;

the M channels having different gains and different offset errors, and the M channels being denoted as $CH_1$, $CH_2$, $CH_3$, ..., $CH_M$; sampling data of the M channels $CH_1$, $CH_2$, $CH_3$, ..., $CH_M$ being respectively denoted as $X_1$, $X_2$, ..., $X_M$; the channel $CH_1$ of the M channels being determined as a reference channel, and the gain-offset error correction being performed on the channels $CH_2$, $CH_3$, ..., $CH_M$, as the target channels, of the M channels according to gain correction values $A_1, A_2, \ldots, A_{M-1}$ of the channels $CH_2$, $CH_3$, ..., $CH_M$ relative to the channel $CH_1$ and offset correction values $B_1, B_2, \ldots, B_{M-1}$ of the channels $CH_2$, $CH_3$, ..., $CH_M$ relative to the channel $CH_1$ by the following formula:

$$\begin{cases} X_2 = A_1 X_2 + B_1 \\ X_3 = A_2 X_3 + B_2 \\ \ldots \\ X_M = A_{M-1} X_M + B_{M-1} \end{cases}$$

the gain correction values $A_1, A_2, \ldots, A_{m-1}$ of the channels $CH_2$, $CH_3$, ..., $CH_M$ relative to the channel $CH_1$ and the offset correction values $B_1, B_2, \ldots, B_{m-1}$ of the channels $CH_2$, $CH_3$, ..., $CH_M$ relative to the channel $CH_1$ being obtained by performing the iterative computations on bipolar signals of the sampling data of two channels of the M channels; and the obtaining the gain correction value $A_m$ and the offset correction value $B_m$ including the following steps:

step 1.1, selecting a first sampling data segment with a length L from the sampling data of the channel $CH_1$ and a second sampling data segment with the length L from the sampling data of the channel $CH_{m+1}$, denoting the first sampling data segment corresponding to the channel $CH_1$ as $X_1(0), X_1(1), \ldots, X_1(L-1)$ and denoting the second sampling data segment corresponding to the channel $CH_{m+1}$ as $X_{m+1}(0)$, $X_{m+1}(1), \ldots, X_{m+1}(L-1)$; initializing a number of the iterative computations i=1, initializing a positive amplitude auxiliary value $P(0)=X_1(0)$, initializing a negative amplitude auxiliary value $N(0)=X_1(0)$, initializing the gain correction value $A_m(0)=1$, and initializing the offset correction value $B_m(0)=0$;

step 1.2, calculating a positive amplitude auxiliary value $P(i)$ of an $i^{th}$ iterative computation and a negative amplitude auxiliary value $N(i)$ of the $i^{th}$ iterative computation according to the following formula:

$P(i) = P(i-1) +$
$[X_1(i-1) + (X_{PMax} - X_{m+1}(i-1)) \times A_m(i-1) + B_m(i-1) - P(i-1)] \times D'$ $N(i) = N(i-1) +$
$[X_1(i-1) + (X_{NMax} - X_{m+1}(i-1)) \times A_m(i-1) + B_m(i-1) - N(i-1)] \times D'$ where $X_{PMax}$ represents a positive base value and is determined as a positive maximum value of a higher gain channel between the channel $CH_1$ and the channel $CH_{m+1}$; $X_{NMax}$ represents a negative base value and is determined as a negative maximum value of the higher gain channel between the channel $CH_1$ and the channel $CH_{m+1}$; $A_m(i-1)$ represents a gain correction value of an $(i-1)^{th}$ iterative computation;

$B_m(i-1)$ represents an offset correction value of the $(i-1)^{th}$ iterative computation; and D' represents an iteration speed;

step 1.3, calculating a gain correction value $A_m(i)$ of the $i^{th}$ iterative computation and an offset correction value $B_m(i)$ of the $i^{th}$ iterative computation according to the following formula:

$$A_m(i) = \frac{P(i) - N(i)}{X_{PMax} - X_{NMax}}$$

$$B_m(i) = \frac{X_{PMax} \times N(i) - X_{NMax} \times P(i)}{2 \times (X_{PMax} - X_{NMax})}$$

step 1.4, calculating an error $\Delta_m(i)$ of the $i^{th}$ iterative computation according to the following formula:

$$\Delta_m(i) = X_1(i) - [A_m(i) \times X_{m+1}(i) + B_m(i)]$$

step 1.5, determining whether the error $\Delta_m(i)$ is less than a set iteration precision; when the error $\Delta_m(i)$ is less than the set iteration precision, determining the gain correction value $A_m(i)$ of the $i^{th}$ iterative computation and the offset correction value $B_m(i)$ of the $i^{th}$ iterative computation as the gain correction value $A_m$ and the offset correction value $B_m$; or when the error $\Delta_m(i)$ is equal to or greater than the set iteration precision, determining i=i+1 and returning and performing the step 1.2;

step 2, obtaining delays of the M channels, constructing a fractional delay filter with a Farrow structure, and performing delay correction on the M channels, which includes the following steps:

step 2.1, obtaining the delays of the target channels, including:

inputting standard signals with same frequency and same phase into the M channels $CH_1$, $CH_2$, $CH_3$, ..., $CH_M$; performing fast Fourier transform (FFT) on the sampling data of the M channels $CH_1$, $CH_2$, $CH_3$, ..., $CH_M$ to obtain results corresponding to the M channels $CH_1$, $CH_2$, $CH_3$, ..., $CH_M$; and obtaining phases $\varphi_m$, m=1, 2, ..., M of the M channels $CH_1$, $CH_2$, $CH_3$, ..., $CH_M$ according to real parts $RE_m$ and imaginary parts $IM_m$, m=1, 2, ..., M of the results by using the following formula:

$$\varphi_m = \arctan\left(\frac{IM_m}{RE_m}\right)$$

obtaining phase differences $\Delta\varphi_1, \Delta\varphi_2, \ldots, \Delta\varphi_{M-1}$ of the channels $CH_2, CH_3, \ldots, CH_M$ relative to the channel $CH_1$ by the following formula:

$$\Delta\varphi_m = \varphi_{m+1} - \varphi_1, m = 1, 2, \ldots, M - 1$$

obtaining the delays $\tau_m$, m=1, 2, ..., M−1 of the channels $CH_2, CH_3, \ldots, CH_M$ relative to the channel $CH_1$ by the following formula:

$$\tau_m = \frac{k'}{360° f_0}\Delta\varphi_m$$

where $f_0$ represents a frequency of each of the standard signals, and k' represents a sampling rate of each of the multiple ADCs;

step 2.2, designing the fractional delay filter with the Farrow structure, including:

determining a coefficient of a fractional delay filter base on Lagrange interpolation by obtaining a maximum flatness in a passband of the fractional delay filter based on Lagrange interpolation; and the coefficient of the fractional delay filter based on Lagrange interpolation being expressed as follows:

$$h(n) = \prod_{\substack{k=0 \\ k \neq n}}^{P} \frac{D-k}{n-k}, n = 0, 1, 2, \ldots, P$$

where P represents an order of the fractional delay filter based on Lagrange interpolation, D=P−2+d, and d represents a fractional delay within a range of 0≤d≤1;

using a wave filter with a Farrow structure to approximate the determined coefficient h(n) of the fractional delay filter based on Lagrange interpolation, thereby obtaining the fractional delay filter with the Farrow structure within the fractional delay of 0≤d≤1 by using the wave filter with the Farrow structure, and obtaining a polynomial h'(n) for the coefficient h(n) of the fractional delay filter based on Lagrange interpolation according to D=P−2+d, and the polynomial h'(n) for the coefficient h(n) of the fractional delay filter based on Lagrange interpolation being expressed by the following formula:

$$h'(n) = \sum_{P=0}^{P} c_P(n)d^P, n = 0, 1, 2, \ldots, P$$

where $c_P(n)$ represents a coefficient of the fractional delay filter with the Farrow structure;

for the channels $CH_2, CH_3, \ldots, CH_M$, the delays $\Sigma_m$, m=1, 2, ..., M−1 being determined as d respectively, and a polynomial $h_m(n)$ for the coefficient of the fractional delay filter with the Farrow structure corresponding to the channels $CH_2, CH_3, \ldots, CH_M$ respectively being obtained as follows:

$$h_m(n) = \sum_{P=0}^{P} c_P(n)\tau_m^P, n = 0, 1, 2, \ldots, P, m = 1, 2, \ldots, M-1$$

for the channel $CH_1$, a decimal delay $\tau_0$ being a constant and being determined as d, and a polynomial $h_0(n)$ for the coefficient of the fractional delay filter with the Farrow structure corresponding to the channel $CH_1$ being obtained as follows:

$$h_0(n) = \sum_{P=0}^{P} c_P(n)\tau_0^P, n = 0, 1, 2, \ldots, P$$

step 2.3, performing the delay correction on the M channels, including:

performing half-band interpolation on the sampling data $X_1$ corresponding to the channel $CH_1$ and the sampling data $X_2, \ldots, X_M$ corresponding to the channels $CH_2, CH_3, \ldots, CH_M$ after the gain-offset error correction performed in the step 1 to obtain processed sampling data, and inputting the processed sampling data into the fractional delay filters $h_0(n), h_1(n), \ldots, h_{M-1}(n)$ with the Farrow structure corresponding to the M channels $CH_1$ $CH_2, CH_3, \ldots, CH_M$ respectively to perform delay filtering, and then performing half-band extraction after the delay filtering to obtain delay-corrected sampling data $X_1, X_2, \ldots, X_M$, thereby completing the delay correction on the M channels; and step 3, data integration, including:

integrating the delay-corrected sampling data $X_1, X_2, \ldots, X_M$ to obtain a multi-ADC acquisition signal.

Specially, the decimal delay $\tau_0$ is set with a precision of ten thousandth of a sampling point.

The objective of the disclosure is realized as follows. The disclosure provides the digital correction method for dynamic range expansion of multiple ADCs, which uses the positive amplitude auxiliary value and the negative amplitude auxiliary value, the positive base value and the negative base value to perform the iterative computations to obtain the gain correction values and the offset correction values of the channels relative to the channel $CH_1$, thereby performing the gain-offset error correction on the channels except for the channel $CH_1$. Then, the phase differences of the channels relative to the standard channel $CH_1$ are calculated to construct the fractional delay filters with the Farrow structure, and the sampling data $X_2, \ldots, X_M$ performed by the gain-offset error correction are further corrected. The disclosure ensures that the respective dynamic ranges of the sampling data with different gains output by the multiple channels are not lost, while completing the digital correction of the sampling data collected from the multiple channels in the multi-ADC system.

DETAILED DESCRIPTION OF EMBODIMENTS

Embodiments of the disclosure are described below with reference to attached drawings, so that those skilled in the related art can better understand the disclosure. It should be noted that in the following description, these detailed descriptions will be omitted here when the detailed descriptions of the known functions and designs may fade the main content of the disclosure.

Figure 1:
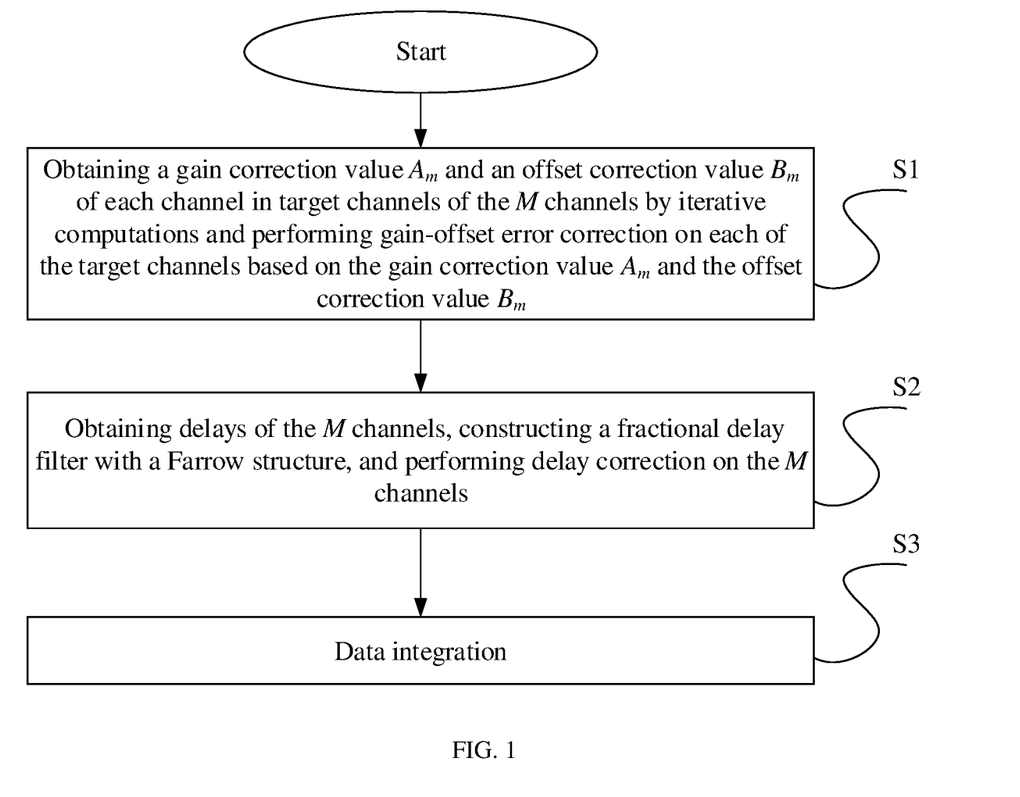
FIG. 1 illustrates a schematic diagram of a flowchart of a digital correction method for dynamic range expansion of multiple ADCs according to an embodiment of the disclosure.

FIG. 1 illustrates a schematic diagram of a flowchart of a digital correction method for dynamic range expansion of multiple analog-to-digital converters (ADCs) according to an embodiment of the disclosure.

In the embodiment, as shown in FIG. 1, a number of channels of the multiple ADCs is M; and the digital correction method for dynamic range expansion of multiple ADCs according to the disclosure includes the following steps.

Step 1, a gain correction value $A_m$, $1 \le m \le M-1$ and an offset correction value $B_m$, $1 \le m \le M-1$ of each channel in target channels of the M channels are obtained by iterative computations, and gain-offset error correction is performed on each of the target channels based on the gain correction value $A_m$ and the offset correction value $B_m$.

The M channels have different gains and different offset errors, and the M channels are denoted as $CH_1$, $CH_2, CH_3, \ldots, CH_M$; sampling data of the M channels $CH_1$, $CH_2, CH_3, \ldots, CH_M$ are respectively denoted as $X_1, X_2, \ldots, X_M$; and the channel $CH_1$ of the M channels is determined as a reference channel. In the embodiment, a channel with a minimum gain of the M channels is determined as the channel $CH_1$, which avoids a loss of dynamic range during digital correction process.

The gain-offset error correction is performed on the channels $CH_2, CH_3, \ldots, CH_M$, as the target channels, of the M channels according to gain correction values $A_1, A_2, \ldots, A_{M-1}$ of the channels $CH_2, CH_3, \ldots, CH_M$ relative to the channel $CH_1$ and offset correction values $B_1$, $B_2, \ldots, B_{M-1}$ of the channels $CH_2, CH_3, \ldots, CH_M$ relative to the channel $CH_1$ by the following formula:

$$\begin{cases} X_2 = A_1 X_2 + B_1 \\ X_3 = A_2 X_3 + B_2 \\ \ldots \\ X_M = A_{M-1} X_M + B_{M-1} \end{cases}$$

In an embodiment, the gain correction values $A_1, A_2, \ldots, A_{M-1}$ of the channels $CH_2, CH_3, \ldots, CH_M$ relative to the channel $CH_1$ and the offset correction values $B_1, B_2, \ldots, B_{M-1}$ of the channels $CH_2, CH_3, \ldots, CH_M$ relative to the channel $CH_1$ are obtained by performing the iterative computations on bipolar signals of the sampling data of two channels (i.e., a to-be-corrected channel selected from the channels $CH_2, CH_3, \ldots, CH_M$ and the reference channel $CH_1$) of the M channels. Since the bipolar signals are divided into positive amplitude and negative amplitude, the iterative computations introduce several additional auxiliary values, including: using a positive maximum value of a higher gain channel between the to-be-corrected channel and the reference channel $CH_1$ as a positive base value $X_{PMax}$, using a negative maximum value of the higher gain channel between the to-be-corrected channel and the reference channel $CH_1$ as a negative base value $X_{NMax}$, a positive amplitude auxiliary value $P(i)$, and a negative amplitude auxiliary value N(i). P(i) and N(i) are used for calculating the gain correction values $A_1, A_2, \ldots, A_{M-1}$ and the offset correction values $B_1, B_2, \ldots, B_{M-1}$ during the iteration computations.

Figure 2:
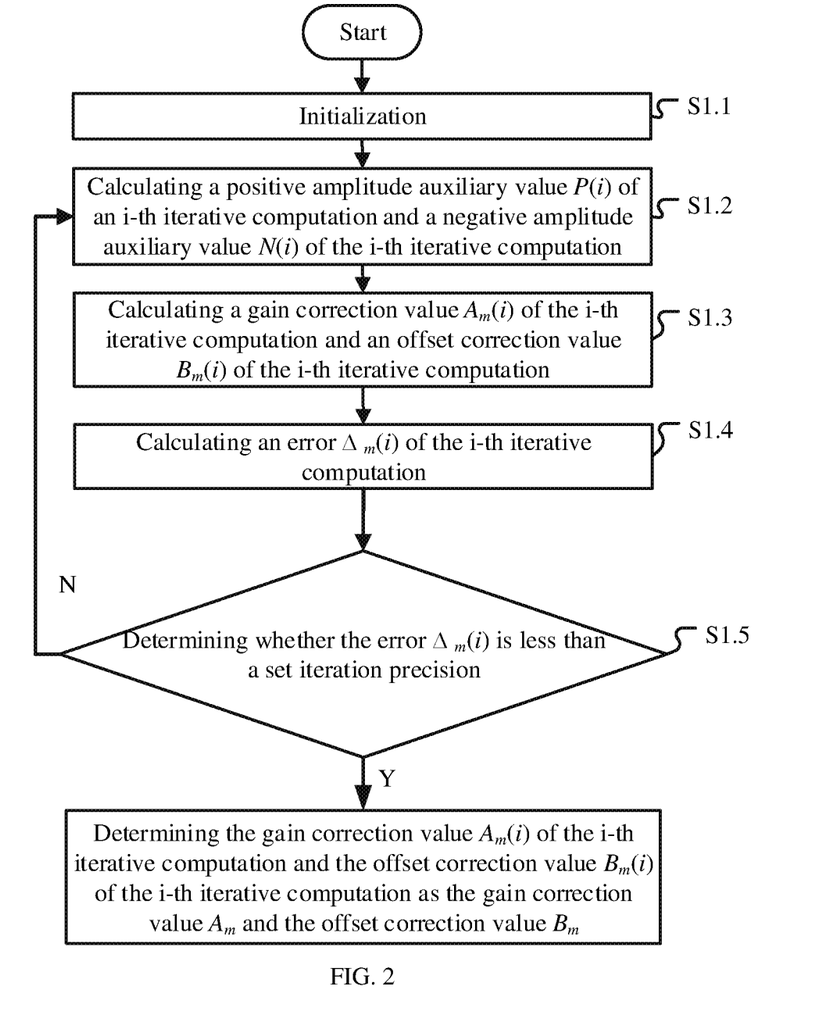
FIG. 2 illustrates a flowchart of obtaining a gain correction value $A_m$ and an offset correction value $B_m$ in step 1 illustrated in FIG. 1.

Specifically, as shown in FIG. 2, the obtaining the gain correction value $A_m$ and the offset correction value $B_m$ includes the following steps.

Step 1.1, an initialization is performed.

A sampling data segment (also referred to a first sampling data segment) with a length L is selected from the sampling data of the channel $CH_1$ and a sampling data segment (also referred to a second sampling data segment) with the length L is selected from the sampling data of the channel $CH_{m+1}$, the sampling data segment corresponding to the channel $CH_1$ is denoted as $X_1(0), X_1(1), \ldots, X_1(L-1)$ and the sampling data segment corresponding to the channel $CH_{m+1}$ is denoted as $X_{m+1}(0), X_{m+1}(1), \ldots, X_{m+1}(L-1)$; a number of the iterative computations is initialized by i=1, a positive amplitude auxiliary value is initialized by $P(0)=X_1(0)$, a negative amplitude auxiliary value is initialized by $N(0)=X_1(0)$, the gain correction value is initialized by $A_m(0)=1$, and the offset correction value is initialized by $B_m(0)=0$.

Step 1.2, a positive amplitude auxiliary value P(i) of an $i^{th}$ iterative computation and a negative amplitude auxiliary value N(i) of the $i^{th}$ iterative computation are calculated according to the following formula:

$$P(i) = P(i-1) + [X_1(i-1) + (X_{PMax} - X_{m+1}(i-1)) \times A_m(i-1) + B_m(i-1) - P(i-1)] \times D';$$

$$N(i) = N(i-1) + [X_1(i-1) + (X_{NMax} - X_{m+1}(i-1)) \times A_m(i-1) + B_m(i-1) - N(i-1)] \times D'.$$

In the above formula, $X_{PMax}$ represents a positive base value and is determined as a positive maximum value of a higher gain channel between the channel $CH_1$ and the channel $CH_{m+1}$; $X_{NMax}$ represents a negative base value and is determined as a negative maximum value of the higher gain channel between the channel $CH_1$ and the channel $CH_{m+1}$; $A_m(i-1)$ represents a gain correction value of an $(i-1)^{th}$ iterative computation; $B_m(i-1)$ represents an offset correction value of the $(i-1)^{th}$ iterative computation; and D' represents an iteration speed.

Step 1.3, a gain correction value $A_m(i)$ of the $i^{th}$ iterative computation and an offset correction value $B_m(i)$ of the $i^{th}$ iterative computation are calculated according to the following formula:

$$A_m(i) = \frac{P(i) - N(i)}{X_{PMax} - X_{NMax}};$$

$$B_m(i) = \frac{X_{PMax} \times N(i) - X_{NMax} \times P(i)}{2 \times (X_{PMax} - X_{NMax})}.$$

Step 1.4, an error $\Delta_m(i)$ of the $i^{th}$ iterative computation is calculated according to the following formula:

$$\Delta_m(i) = X_1(i) - [A_m(i) \times X_{m+1}(i) + B_m(i)].$$

Step 1.5, whether the error $\Delta_m(i)$ is less than a set iteration precision is determined; when the error $\Delta_m(i)$ is less than the set iteration precision, the gain correction value $A_m(i)$ of the $i^{th}$ iterative computation and the offset correction value $B_m(i)$ of the $i^{th}$ iterative computation are determined as the gain correction value $A_m$ and the offset correction value $B_m$; or when the error $\Delta_m(i)$ is equal to or greater than the set iteration precision, i=i+1 is determined and step 1.2 is returned and performed.

Figure 3:
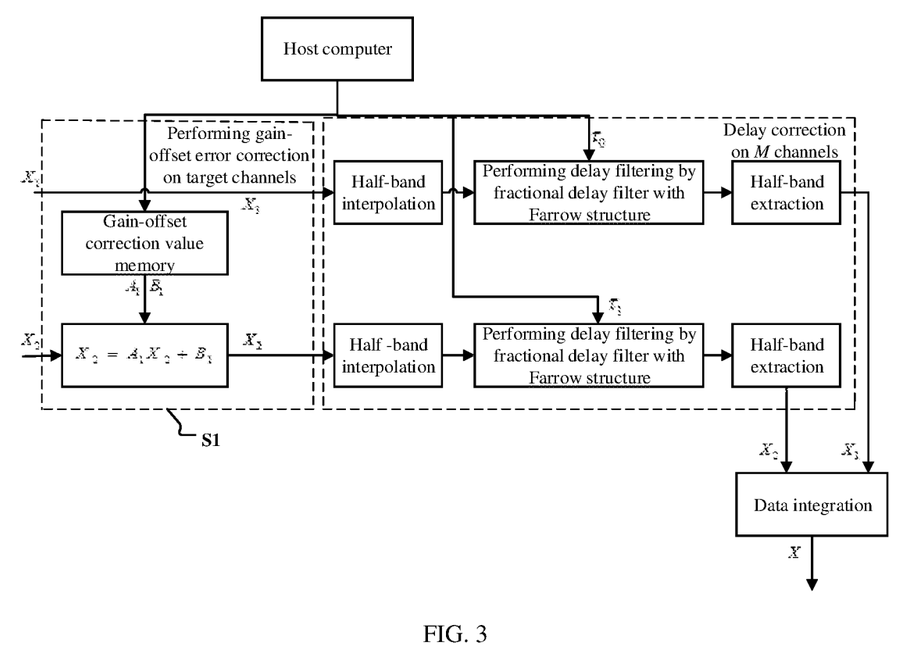
FIG. 3 illustrates a schematic diagram of a principle of the digital correction method for dynamic range expansion of multiple ADCs according to the embodiment of the disclosure.

Since the multiple ADCs are similar, in an illustrated embodiment, as shown in FIG. 3, two ADCs are used as an example for description. In the embodiment, the disclosure only needs to calculate the gain correction value $A_1$ and the offset correction value $B_1$ of the channel $CH_2$, and to perform the gain-offset error correction on the channel $CH_2$ according to a formula as follows:

$$X_2 = A_1 X_2 + B_1.$$

Step 2: delays of the M channels are obtained, a fractional delay filter with a Farrow structure is constructed (the multiple M channels corresponding to multiple fractional delay filters with the Farrow structure), and delay correction is performed on the M channels.

In an embodiment, the step 2 includes the following steps.

Step 2.1: the delays of the target channels are obtained.

In the step 2.1, in combination with spectrum analysis, a corresponding phase spectrum is obtained according to a corresponding real part and a corresponding imaginary part based on fast Fourier transform (FFT), which is convenient for measuring a phase difference of a signal at a certain frequency point. When measuring the delay of a single frequency point, the standard signal corresponding to the single frequency point is input through a signal source, the standard signals with same frequency and same phase are input into the M channels, the channel $CH_1$ is used as the reference channel, phases of M standard frequency points corresponding to the M channels are calculated based on FFT, and then phase differences of the channels $CH_2, CH_3, \ldots, CH_M$ relative to the channel $CH_1$ at the same frequency point are obtained, thereby estimating the delay of the to-be-corrected channel relative to the channel $CH_1$ according to the corresponding phase difference of the single frequency point.

Specifically, the step of obtaining the delays of the target channels includes the following steps:

inputting standard signals with same frequency and same phase into the M channels $CH_1, CH_2, CH_3, \ldots, CH_M$; performing fast Fourier transform (FFT) on the sampling data of the M channels $CH_1, CH_2, CH_3, \ldots, CH_M$ to obtain results corresponding to the M channels $CH_1, CH_2, CH_3, \ldots, CH_M$; and obtaining phases $\varphi_m$, m=1, 2, \ldots, M of the M channels $CH_1, CH_2, CH_3, \ldots, CH_M$ according to real parts $RE_m$ and imaginary parts $IM_m$, m=1, 2, \ldots, M of the results by using the following formula:

$$\varphi_m = \arctan\left(\frac{IM_m}{RE_m}\right);$$

obtaining phase differences $\Delta\varphi_1, \Delta\varphi_2, \ldots, \Delta\varphi_{M-1}$ of the channels $CH_2, CH_3, \ldots, CH_M$ relative to the channel $CH_1$ by the following formula:

$$\Delta\varphi_m = \varphi_{m+1} - \varphi_1, m = 1, 2, \ldots, M-1;$$

obtaining the delays $\tau_m$, m=1, 2, ..., M−1 of the channels $CH_2$, $CH_3$, ..., $CH_M$ relative to the channel $CH_1$ by the following formula:

$$\tau_m = \frac{k'}{360°f_0}\Delta\varphi_m;$$

where $f_0$ represents a frequency of each of the standard signals, and k' represents a sampling rate of each of the multiple ADCs.

Figure 4:
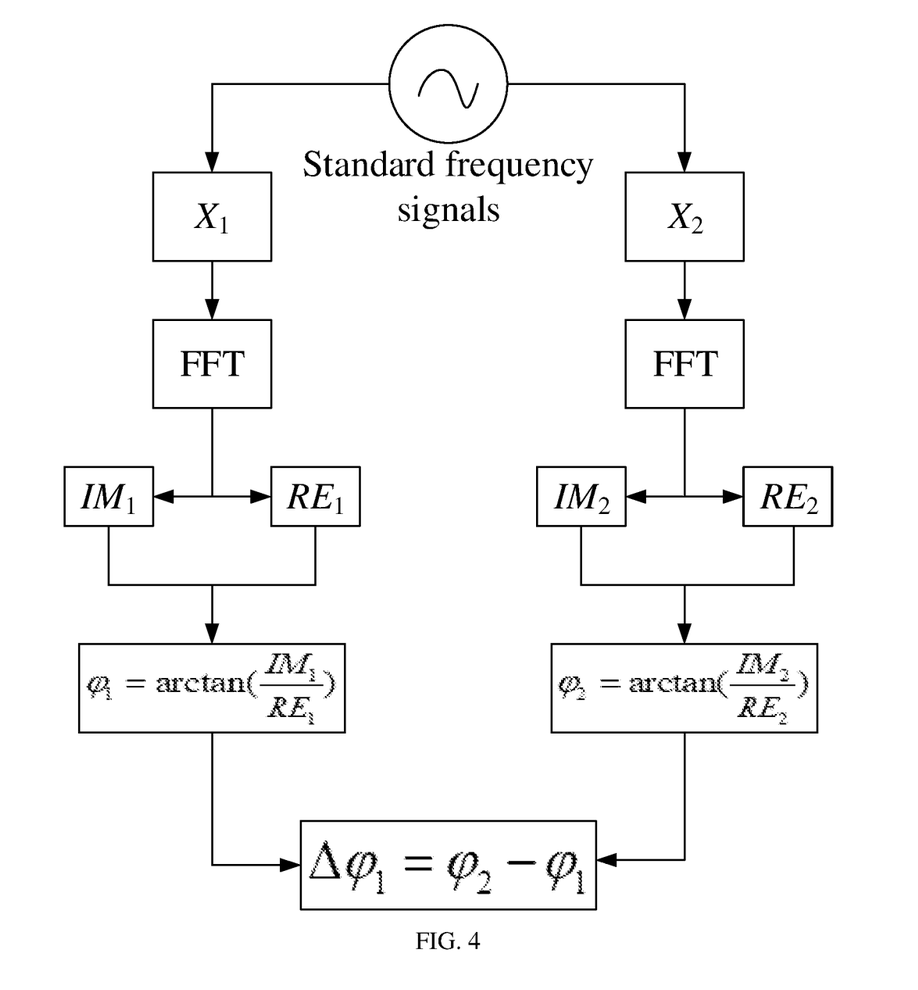
FIG. 4 illustrates a schematic diagram of obtaining a phase difference.

In an illustrated embodiment, the sampling rate of the ADC is 262.144 kilohertz (kHz), and an analysis bandwidth of the multi-ADS system is 102.4 kHz. As shown in FIG. 4, a host computer obtains the phase difference corresponding to the certain frequency point according to the real parts $RE_1$ and $RE_2$ and the imaginary part $IM_1$ and $IM_2$ based on the FFT. When the delay of the single frequency point is measured, the standard signal with a frequency of 1.024 kHz is input into each channel of the M channels through the signal source, the sampling rate is 262.144 kHz, and an FFT analysis at 8192 points is performed, so that the standard signal with the frequency of 1.024 kHz is located at a point of the $32^{th}$ FFT, and then the corresponding imaginary part and the corresponding real part are $IM_1$ and $IM_2$ and $RE_1$ and $RE_2$, the phase difference $\Delta\varphi_1$ between the phase $\varphi_1$ and the phase $\varphi_2$ is obtained by $\Delta\varphi_1=\varphi_2-\varphi_1$; and the phase $\varphi_1$ and the phase $\varphi_2$ are calculated by arctangent values between the real parts of $RE_1$ $RE_2$ and the imaginary parts of $IM_1$ $IM_2$ of the two channels (i.e., the channel $CH_1$ and the channel $CH_2$) based on the FFT. If the phase difference $\Delta\varphi_1$ between the two channels at the same frequency point is 0.08°, and the delay $\tau_1$ between the two channels is estimated according to the phase difference of the single frequency point as follows:

$$\tau_1 = \frac{k'}{360°f_0}\Delta\varphi_1 = \frac{262.144\ \text{kHz} \times 0.08°}{1.024\ \text{kHz} \times 360°} = 0.05689.$$

Step 2.2: the fractional delay filter with the Farrow structure is designed, including the following steps:

determining a coefficient of a fractional delay filter base on Lagrange interpolation by obtaining a maximum flatness in a passband of the fractional delay filter based on Lagrange interpolation; and the coefficient of the fractional delay filter based on Lagrange interpolation being expressed as follows:

$$h(n) = \prod_{\substack{k=0 \\ k \neq n}}^{P} \frac{D-k}{n-k},\ n = 0, 1, 2, \ldots, P$$

where P represents an order of the fractional delay filter based on Lagrange interpolation, D=P−2+d, and d represents a fractional delay within a range of 0 d≤1.

In an illustrated embodiment, the order P of the fractional delay filter based on Lagrange interpolation is P=3, which is taken as an example, the coefficient of the fractional delay filter based on Lagrange interpolation is shown in Table 1 as follows:

TABLE 1

| | h(0) | h(1) | h(2) | h(3) |
|---|---|---|---|---|
| P = 3 | −(D − 1)(D − 2)(D − 3)/6 | D(D − 2)(D − 3)/2 | −D(D − 1)(D − 3)/2 | D(D − 1)(D − 2)/6 |

The step 2.2 further includes: using a wave filter with a Farrow structure to approximate the determined coefficient h(n) of the fractional delay filter based on Lagrange interpolation, thereby obtaining an optimal fractional delay filter (i.e., the fractional delay filter with the Farrow structure) within the fractional delay of 0≤d≤1 by using the wave filter with the Farrow structure, and obtaining a polynomial h'(n) for the coefficient h(n) of the fractional delay filter based on Lagrange interpolation according to D=P−2+d, and the polynomial h'(n) for the coefficient h(n) of the fractional delay filter based on Lagrange interpolation being expressed by the following formula:

h'(n)=$\Sigma_{P=0}^P c_P(n)d^P$, n=0, 1, 2, ..., P, where $c_P(n)$ represents a coefficient of the fractional delay filter with the Farrow structure.

In an illustrated embodiment, the order P of the fractional delay filter based on Lagrange interpolation is P=3, an expression of the coefficient of the fractional delay filter based on Lagrange interpolation with third-order Farrow structure is expressed as follows:

$$\begin{cases} h_d(0) = -\frac{1}{6}d^3 + \frac{1}{2}d^2 - \frac{1}{3}d \\ h_d(1) = \frac{1}{2}d^3 - d^2 - \frac{1}{2}d + 1 \\ h_d(2) = -\frac{1}{2}d^3 + \frac{1}{2}d^2 + d \\ h_d(3) = \frac{1}{6}d^3 - \frac{1}{6}d \end{cases}.$$

The coefficient $c_P(n)$ of the fractional delay filter with the third-order Farrow structure according to the Lagrange interpolation is obtained as follows:

$$c_p(n) = \begin{pmatrix} c_3(0) & c_2(0) & c_1(0) & c_0(0) \\ c_3(1) & c_2(1) & c_1(1) & c_0(1) \\ c_3(2) & c_2(2) & c_1(2) & c_0(2) \\ c_3(3) & c_2(3) & c_1(3) & c_0(3) \end{pmatrix} = \begin{pmatrix} -\frac{1}{6} & \frac{1}{2} & -\frac{1}{3} & 0 \\ \frac{1}{2} & -1 & -\frac{1}{2} & 1 \\ -\frac{1}{2} & \frac{1}{2} & 1 & 0 \\ \frac{1}{6} & 0 & -\frac{1}{6} & 0 \end{pmatrix}.$$

For the channels $CH_2$, $CH_3$, ..., $CH_M$, the delays $\tau_m$, m=1, 2, ..., M−1 obtained in the step 2.1 are determined as d respectively, and therefore the fractional delay filters $h_m(n)$ with the Farrow structure (also referred to the polynomials for the coefficient of the fractional delay filter with the Farrow structure) corresponding to the channels $CH_2$, $CH_3$, ..., $CH_M$ are obtained as follows:

$$h_m(n) = \sum_{P=0}^{P} c_P(n)\tau_m^P,\ n = 0, 1, 2, \ldots, P, m = 1, 2, \ldots, M-1$$

For the channel $CH_1$, a decimal delay $\tau_0$ with a precision of ten thousandth of a sampling point is determined as d, and the polynomial $h_0(n)$ for the coefficient of the fractional delay filter with the Farrow structure corresponding to the channel $CH_1$ is obtained as follows:

$$h_0(n) = \sum_{P=0}^{P} c_P(n)\tau_0^P, n = 0, 1, 2, \ldots, P$$

Specially, the decimal delay $\tau_0$ is a constant.

Step 2.3: the delay correction is performed on the M channels as follows.

The delay correction uses the fractional delay filters with the Farrow structure corresponding to the M channels to eliminate delay inconsistency of the sampling data of the M channels. Meanwhile, due to the fact that a bandwidth of the fractional delay filter with the Farrow structure is designed to be low by using the maximum flatness in the passband of the fractional delay filter based on Lagrange interpolation, the interpolation can be used to improve data rate, and data extraction can be performed after the delay correction is realized by the fractional delay filter with the Farrow structure. Specifically, the step 2.3 includes the following steps: performing half-band interpolation on the sampling data $X_1$ corresponding to the channel $CH_1$ and the sampling data $X_2, \ldots, X_M$ corresponding to the channels $CH_2, CH_3, \ldots, CH_M$ after the gain-offset error correction performed in the step 1 to obtain processed sampling data, and inputting the processed sampling data into the fractional delay filters (also referred to the polynomials for the coefficient of the fractional delay filter with the Farrow structure corresponding to the M channels obtained in the step 2.2) $h_0(n), h_1(n), \ldots, h_{M-1}(n)$ with the Farrow structure corresponding to the M channels $CH_1, CH_2, CH_3, \ldots, CH_M$ respectively to perform delay filtering, and then performing half-band extraction after the delay filtering to obtain delay-corrected sampling data $X_1, X_2, \ldots, X_M$, thereby completing the delay correction on the M channels.

In an illustrated embodiment, as shown in FIG. 3, the sampling data $X_1$ corresponding to the channel $CH_1$ and the sampling data $X_2$ corresponding to the channel $CH_2$ after the gain-offset error correction is performed in the step 1 are respectively subjected to the half-band interpolation, and then respectively sent to the corresponding fractional delay filter with the Farrow structure respectively, i.e., $h_0(n)$ and $h_1(n)$, to perform the delay filtering, and then the half-band extraction is performed after the delay filtering to obtain delay-corrected sampling data $X_1$ and $X_2$, thereby completing the delay correction on the channel $CH_1$ and the channel $CH_2$.

In an illustrated embodiment, the disclosure use a seven-order wave filter with the Farrow structure to perform channel fixed delay correction based on linear phase characteristic, a normalized passband of the seven-order wave filter with the Farrow structure is only 52 kHz at the sampling rate of 262.144 kHz, the sampling rate is first increased to 524.288 kHz by using the half-band interpolation, and at this time, the passband of the seven-order wave filter with the Farrow structure meets a passband requirement of 105 kHz.

The sampling data of the two channels are corrected by the seven-order wave filter with the Farrow structure respectively. Specially, the fractional delay filter with the Farrow structure is set with a small delay of 0.0001 (i.e., the constant for the decimal delay) to compensate for the amplitude and full cycle delay of the sampling data in the channel $CH_1$.

Step 3: data integration is performed.

The step 3 includes: integrating the delay-corrected sampling data $X_1, X_2, \ldots, X_M$ to obtain a multi-ADC acquisition signal.

Figure 5A:
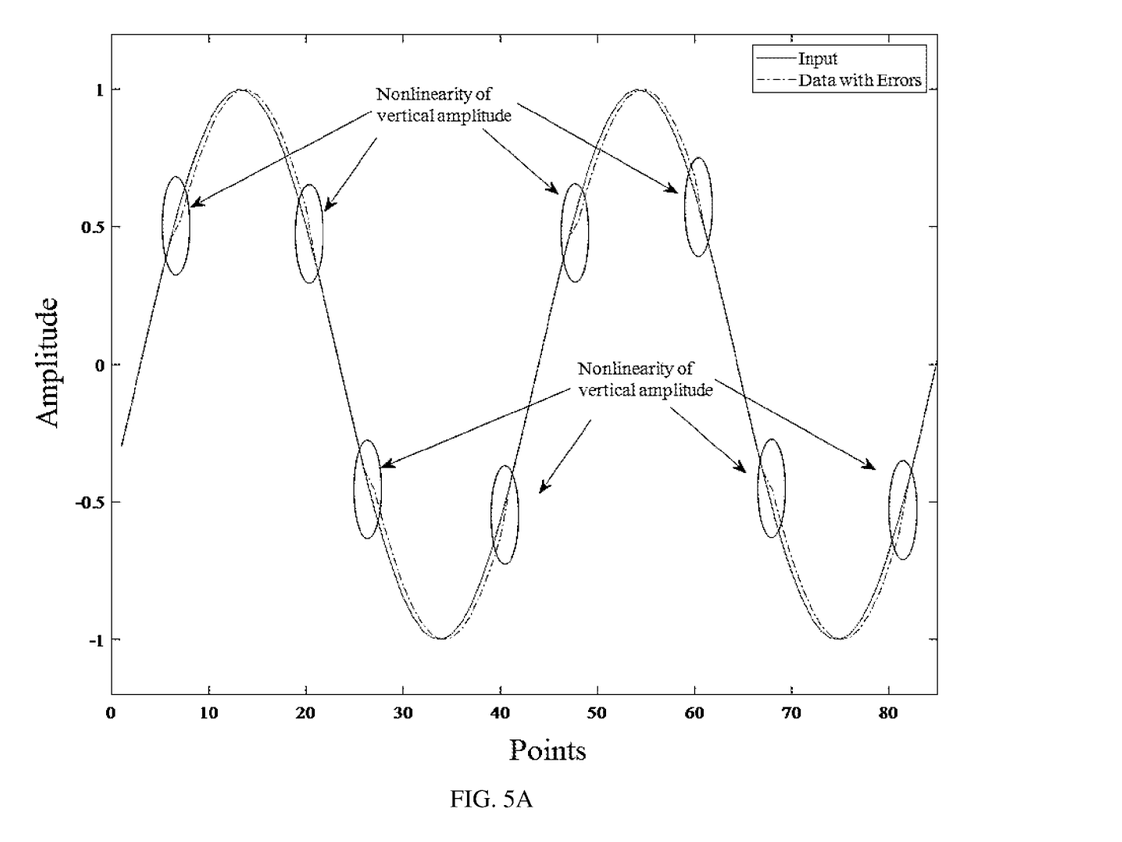
FIG. 5A illustrates a schematic diagram of an output signal before digital correction.
Figure 5B:
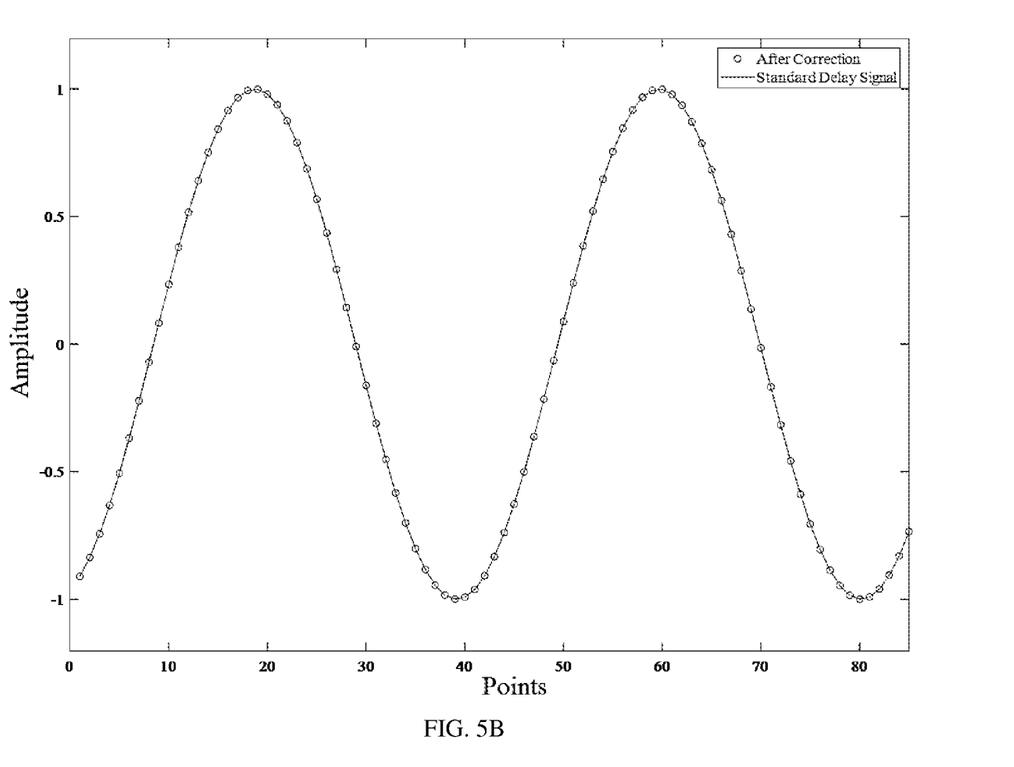
FIG. 5B illustrates a schematic diagram of the output signal after the digital correction.

According to an actual application scenario of dynamic range expansion, sampling data with different amplitudes needs to be selected for integration by more different gains of the multiple channels. In an illustrated embodiment, the input signal is a sine wave, as shown in FIG. 5A, circles illustrated in FIG. 5A indicate occurrence points of vertical nonlinearity caused by delay error after data integration, and it can be seen that due to the existence of the delay error, time domain waveform of an output signal generates obvious distortion. Meanwhile, as shown in FIG. 5B, after the digital correction is performed, the two lines illustrated in FIG. 5B coincide with each other to represent the correction filter to well correct the delay error, so that the waveform distortion is improved.

Although the foregoing has been described with respect to the illustrated embodiments of the disclosure, it will be apparent to those skilled in the related art that the disclosure is not limited to the scope of the illustrated embodiments. Moreover, it will be apparent to those skilled in the related art that such variations are obvious to those skilled in the related art, as long as the variations fall within the spirit and scope of the disclosure, all of which are protected by the disclosure.

What is claimed is:

1. A digital correction method for dynamic range expansion of multiple analog-to-digital converters (ADCs), wherein a number of channels of the multiple ADCs is M; and the digital correction method comprises the following steps:

step 1, obtaining a gain correction value $A_m$, $1 \leq m \leq M-1$ and an offset correction value $B_m$, $1 \leq m \leq M-1$ of each channel in target channels of the M channels by iterative computations, and performing gain-offset error correction on each of the target channels based on the gain correction value $A_m$ and the offset correction value $B_m$;

wherein the M channels have different gains and different offset errors, and the M channels are denoted as $CH_1$, $CH_2, CH_3, \ldots, CH_M$; sampling data of the M channels $CH_1, CH_2, CH_3, \ldots, CH_M$ are respectively denoted as $X_1, X_2, \ldots, X_M$; the channel $CH_1$ of the M channels is determined as a reference channel, and the gain-offset error correction is performed on the channels $CH_2, CH_3, \ldots, CH_M$, as the target channels, of the M channels according to gain correction values $A_1, A_2, \ldots, A_{M-1}$ of the channels $CH_2, CH_3, \ldots, CH_M$ relative to the channel $CH_1$ and offset correction values $B_1, B_2, \ldots, B_{M-1}$ of the channels $CH_2, CH_3, \ldots, CH_M$ relative to the channel $CH_1$ by the following formula:

$$\begin{cases} X_2 = A_1 X_2 + B_1 \\ X_3 = A_2 X_3 + B_2 \\ \ldots \\ X_M = A_{M-1} X_M + B_{M-1} \end{cases} ;$$

wherein the gain correction values $A_1, A_2, \ldots, A_{M-1}$ of the channels $CH_2, CH_3, \ldots, CH_M$ relative to the channel $CH_1$ and the offset correction values $B_1, B_2, \ldots, B_{M-1}$ of the channels $CH_2, CH_3, \ldots, CH_M$ relative to the channel $CH_1$ are obtained by performing the iterative computations on bipolar signals of the sampling data of two channels of the M channels; and the obtaining the gain correction value $A_m$ and the offset correction value $B_m$ comprises the following steps:

step 1.1, selecting a first sampling data segment with a length L from the sampling data of the channel $CH_1$ and a second sampling data segment with the length L from the sampling data of the channel $CH_{m+1}$, denoting the first sampling data segment corresponding to the channel $CH_1$ as $X_1(0), X_1(1), \ldots, X_1(L-1)$ and denoting the second sampling data segment corresponding to the channel $CH_{m+1}$ as $X_{m+1}(0), X_{m+1}(1), \ldots, X_{m+1}(L-1)$; initializing a number of the iterative computations i=1, initializing a positive amplitude auxiliary value $P(0)=X_1(0)$, initializing a negative amplitude auxiliary value $N(0)=X_1(0)$, initializing the gain correction value $A_m(0)=1$, and initializing the offset correction value $B_m(0)=0$;

step 1.2, calculating a positive amplitude auxiliary value P(i) of an $i^{th}$ iterative computation and a negative amplitude auxiliary value N(i) of the $i^{th}$ iterative computation according to the following formula:

$$P(i) = P(i-1) + [X_1(i-1) + (X_{PMax} - X_{m+1}(i-1)) \times A_m(i-1) + B_m(i-1) - P(i-1)] \times D';$$

$$N(i) = N(i-1) + [X_1(i-1) + (X_{NMax} - X_{m+1}(i-1)) \times A_m(i-1) + B_m(i-1) - N(i-1)] \times D';$$

wherein $X_{PMax}$ represents a positive base value and is determined as a positive maximum value of a higher gain channel between the channel $CH_1$ and the channel $CH_{m+1}$; $X_{NMax}$ represents a negative base value and is determined as a negative maximum value of the higher gain channel between the channel $CH_1$ and the channel $CH_{m+1}$; $A_m(i-1)$ represents a gain correction value of an $(i-1)^{th}$ iterative computation; $B_m(i-1)$ represents an offset correction value of the $(i-1)^{th}$ iterative computation; and D' represents an iteration speed;

step 1.3, calculating a gain correction value $A_m(i)$ of the $i^{th}$ iterative computation and an offset correction value $B_m(i)$ of the $i^{th}$ iterative computation according to the following formula:

$$A_m(i) = \frac{P(i) - N(i)}{X_{PMax} - X_{NMax}};$$

$$B_m(i) = \frac{X_{PMax} \times N(i) - X_{NMax} \times P(i)}{2 \times (X_{PMax} - X_{NMax})};$$

step 1.4, calculating an error $\Delta_m(i)$ of the $i^{th}$ iterative computation according to the following formula:

$$\Delta_m(i) = X_1(i) - [A_m(i) \times X_{m+1}(i) + B_m(i)];$$

and step 1.5, determining whether the error $\Delta_m(i)$ is less than a set iteration precision; when the error $\Delta_m(i)$ is less than the set iteration precision, determining the gain correction value $A_m(i)$ of the $i^{th}$ iterative computation and the offset correction value $B_m(i)$ of the $i^{th}$ iterative computation as the gain correction value $A_m$ and the offset correction value $B_m$; or when the error $\Delta_m(i)$ is equal to or greater than the set iteration precision, determining i=i+1 and returning and performing the step 1.2;

step 2, obtaining delays of the M channels, constructing a fractional delay filter with a Farrow structure, and performing delay correction on the M channels;

wherein the step 2 comprises the following steps:

step 2.1, obtaining the delays of the target channels, comprising:

inputting standard signals with same frequency and same phase into the M channels $CH_1$, $CH_2$, $CH_3$, . . . , $CH_M$; performing fast Fourier transform (FFT) on the sampling data of the M channels $CH_1$, $CH_2$, $CH_3$, . . . , $CH_M$ to obtain results corresponding to the M channels $CH_1$, $CH_2$, $CH_3$, . . . , $CH_M$; and obtaining phases $\varphi_m$, m=1, 2, . . . , M of the M channels $CH_1$, $CH_2$, $CH_3$, . . . , $CH_M$ according to real parts $RE_m$ and imaginary parts $IM_m$, m=1, 2, . . . , M of the results by using the following formula:

$$\varphi_m = \arctan\left(\frac{IM_m}{RE_m}\right), m = 1, 2, \ldots, M;$$

obtaining phase differences $\Delta\varphi_1, \Delta\varphi_2, \ldots, \Delta\varphi_{M-1}$ of the channels $CH_2, CH_3, \ldots, CH_M$ relative to the channel $CH_1$ by the following formula:

$$\Delta\varphi_m = \varphi_{m+1} - \varphi_1, m = 1, 2, \ldots, M-1;$$

obtaining the delays $\tau_m$, m=1, 2, . . . , M−1 of the channels $CH_2, CH_3, \ldots, CH_M$ relative to the channel $CH_1$ by the following formula:

$$\tau_m = \frac{k'}{360° f_0} \Delta\varphi_m;$$

where $f_0$ represents a frequency of each of the standard signals, and k' represents a sampling rate of each of the multiple ADCs;

step 2.2, designing the fractional delay filter with the Farrow structure, comprising:

determining a coefficient of a fractional delay filter base on Lagrange interpolation by obtaining a maximum flatness in a passband of the fractional delay filter based on Lagrange interpolation; and the coefficient of the fractional delay filter based on Lagrange interpolation being expressed as follows:

$$h(n) = \prod_{\substack{k=0 \\ k \neq n}}^{P} \frac{D-k}{n-k}, n = 0, 1, 2, \ldots, P;$$

wherein P represents an order of the fractional delay filter based on Lagrange interpolation, D=P−2+d, and d represents a fractional delay within a range of 0≤d≤1;

using a wave filter with a Farrow structure to approximate the determined coefficient h(n) of the fractional delay filter based on Lagrange interpolation, thereby obtaining the fractional delay filter with the Farrow structure within the fractional delay of $0 \leq d \leq 1$ by using the wave filter with the Farrow structure, and obtaining a polynomial h'(n) for the coefficient h(n) of the fractional delay filter based on Lagrange interpolation according to D=P−2+d, and the polynomial h'(n) for the coefficient h(n) of the fractional delay filter based on Lagrange interpolation being expressed by the following formula:

$$h'(n) = \sum\nolimits_{P=0}^{P} c_P(n) d^P, n = 0, 1, 2, \ldots, P;$$

wherein $c_P(n)$ represents a coefficient of the fractional delay filter with the Farrow structure;
wherein for the channels $CH_2, CH_3, \ldots, CH_M$, the delays $\tau_m$, m=1, 2, . . . , M−1 are determined as d respectively, and a polynomial for the coefficient of the fractional delay filter with the Farrow structure corresponding to the channels $CH_2, CH_3, \ldots, CH_M$ respectively is obtained as follows:

$$h_m(n) = \sum\nolimits_{P=0}^{P} c_P(n) \tau_m^P, n = 0, 1, 2, \ldots, P, m = 1, 2, \ldots, M-1;$$

wherein for the channel $CH_1$, a decimal delay $\tau_0$ is a constant and is determined as d, and a polynomial for the coefficient of the fractional delay filter with the Farrow structure corresponding to the channel $CH_1$ is obtained as follows:

$$h_0(n) = \sum\nolimits_{P=0}^{P} c_P(n) \tau_0^P, n = 0, 1, 2, \ldots, P;$$

step 2.3, performing the delay correction on the M channels, comprising:
performing half-band interpolation on the sampling data $X_1$ corresponding to the channel $CH_1$ and the sampling data $X_2, \ldots, X_M$ corresponding to the channels $CH_2, CH_3, \ldots, CH_M$ after the gain-offset error correction performed in the step 1 to obtain processed sampling data, and inputting the processed sampling data into the fractional delay filters $h_0(n), h_1(n), \ldots, h_{M-1}(n)$ with the Farrow structure corresponding to the M channels $CH_1, CH_2, CH_3, \ldots, CH_M$ respectively to perform delay filtering, and then performing half-band extraction after the delay filtering to obtain delay-corrected sampling data $X_1, X_2, \ldots, X_M$, thereby completing the delay correction on the M channels; and step 3, data integration, comprising:
integrating the delay-corrected sampling data $X_1, X_2, \ldots, X_M$ to obtain a multi-ADC acquisition signal.

2. The digital correction method for dynamic range expansion of multiple ADCs according to claim 1, further comprising: determining a channel with a minimum gain of the M channels as the channel $CH_1$.

* * * * *